United States Patent

Van der Zwart

[11] Patent Number: 4,742,311
[45] Date of Patent: May 3, 1988

[54] CIRCUIT ARRANGEMENT WITH A LOAD CONNECTED TO THE OUTPUT OF AN AMPLIFIER ESPECIALLY FOR NMR

[75] Inventor: Alfred J. Van der Zwart, Eindhoven, Netherlands

[73] Assignee: U.S. Philips Corporation, Tarrytown, N.Y.

[21] Appl. No.: 899,705

[22] Filed: Aug. 25, 1986

[30] Foreign Application Priority Data

Aug. 28, 1985 [DE] Fed. Rep. of Germany ....... 3530637

[51] Int. Cl.$^4$ ............................................. H03F 1/00
[52] U.S. Cl. .................................. 330/297; 324/309; 330/202
[58] Field of Search ................. 330/202, 297; 324/309

[56] References Cited

U.S. PATENT DOCUMENTS

| | | | |
|---|---|---|---|
| 4,329,657 | 5/1982 | Kamiya | 330/297 |
| 4,403,197 | 9/1983 | Swanson | 330/10 |
| 4,447,791 | 5/1984 | Noro et al. | 330/297 |

FOREIGN PATENT DOCUMENTS

| | | | |
|---|---|---|---|
| 147306 | 7/1985 | European Pat. Off. | 330/297 |
| 2120884 | 12/1983 | United Kingdom . | |

*Primary Examiner*—James B. Mullins
*Attorney, Agent, or Firm*—David R. Treacy; Bernard Franzblau

[57] ABSTRACT

A circuit in which a load connected to the output of an amplifier, and in particular for the gradient coil arrangement in a nuclear magnetic resonance tomography unit. To reduce the power loss in the amplifier, especially where, as in NMR tomography, high currents must be switched in relatively short time intervals, the supply voltage for the amplifier is delivered by a d.c. voltage generator the output voltage of which follows the input voltage in steps, but always remains a certain amount larger than the output voltage of the amplifier assigned to the respective input voltage.

15 Claims, 2 Drawing Sheets

CIRCUIT ARRANGEMENT WITH A LOAD CONNECTED TO THE OUTPUT OF AN AMPLIFIER ESPECIALLY FOR NMR

BACKGROUND OF THE INVENTION

This invention relates to a circuit arrangement with a load connected to the output of an amplifier and a voltage generator having a d.c. output that delivers the supply voltage for at least the output stage of the amplifier.

Such circuit arrangements are used, for example, in an NMR tomography unit for the generation of magnetic gradient fields by means of a gradient coil arrangement which in this case forms the load on the amplifier. FIG. 1a shows the typical time curve of the magnetic flux for such a gradient coil arrangement. If the eddy current effects are disregarded, then the current through this coil arrangement has the same curve. Its amplitude in this case is typically 200 A.

FIG. 1b shows the time curve of the voltage at the gradient coil arrangement which is necessary for the current curve shown in FIG. 1a. During the rise and fall of the current two voltage pulses of relatively high amplitude (of the order of 70 V) have to be produced. Between these pulses there has to be a voltage which is just sufficient to compensate the active resistance loss of the coil arrangement.

The supply voltage for the amplifier feeding the coil arrangement must be slightly higher than the peak voltage at the gradient coil arrangement. The power loss in the amplifier is given by the integral of the product of the current as shown in FIG. 1a and the difference between the supply voltage and the voltage as in FIG. 1b. It is particularly large if the current through the coil arrangement is large and the voltage at the coil arrangement is small.

SUMMARY OF THE INVENTION

It is an object of the invention to design a circuit arrangement of the type mentioned in the preamble such that the power loss, which is converted into heat in the amplifier is smaller than in the above-described case.

The invention achieves this object in that the voltage generator contains several d.c. voltage sources with d.c. voltage of varying magnitude and a switch arrangement which connects one of the d.c. voltage sources or the series arrangement of several d.c. voltage sources to the d.c. voltage output, a control circuit is provided which derives a control voltage for controlling the switch arrangement from the input signal of the amplifier in such a way that the voltage at the d.c. output follows the input voltage in steps, but always remains a certain amount larger than the amount of the input voltage multiplied by the gain of the amplifier.

In this case, therefore, the circuit arrangement which determines the voltage at the d.c. voltage output is switched in such a way that this voltage is always somewhat larger than the inherently required voltage at the load. The difference between the supply voltage and the voltage at the load is relatively small therefore so that the power loss converted into heat in the amplifier is also considerably smaller than in the case of a system with a constant supply voltage. The supply voltage required for the amplifier results from its input voltage which is converted by the control circuit into a control signal for the control circuit. Because the rate of change of the supply voltage is determined only by the switching time of the switches, and not by capacitors or the like, it can respond very rapidly to changes of the input voltage.

The number of different supply voltages which the voltage generator as configured in claim 1 can deliver is greater than the number of the d.c. voltage sources because several of the sources can also be connected in series to produce the supply voltage. In principle it should be possible to obtain any combination of the d.c. voltage sources by connecting a switch in series with each d.c. voltage source and by connecting a switch in parallel each time with this series arrangement. However, this requires two switches in push-pull connection and suitable measures to prevent the two switches from inadvertently being closed at the same time, which would result in short-circuiting of the d.c. voltage source in question. This expense can be reduced by a further development in which the switch arrangement for each d.c. voltage source has a series-connected switch for this purpose and each of these series arrangements is connected in parallel with a diode which is driven in the reverse direction for the d.c. voltage in question. Then every time a switch is opened, the supply voltage of the d.c. voltage generator flows through the parallel-connected diode element.

A further development of the invention has provision for a capacitor to be connected in parallel to at least one d.c. voltage source. This development is useful in all cases in which the relevant d.c. voltage source is switched on only for a relatively short time. When feeding gradient coils, for example, the d.c. voltage source is switched on for the maximum d.c. voltage only during the current rise and fall. If the capacitor connected in parallel with it is dimensioned in such a way that it is discharged only negligibly by the current flowing during these periods, the d.c. voltage source does not have to produce this peak output and need only be designed for the mean output required.

In a further development of the invention the d.c. voltage of each source is in each case twice as big or twice as small as the next smallest or next largest d.c. voltage respectively of another d.c. voltage source i.e. the voltages of the DC voltage sources are in a binary weighted sequence (1, 2, 4, etc.). The control circuit then contains an analog-digital converter which converts a signal derived from the amplifier input signal into a binary coded data word of which the most significant bits form the control signal and the high-order bit in each case activates the d.c. voltage source with the higher d.c. voltage. In this way a relatively simple construction of the control circuit is obtained by means of an analog-digital converter. The only additional measures which need to be taken are to ensure that the voltage at the d.c. voltage output of the voltage generator follows the input voltage in steps, but by an amount which always remains a certain amount larger than the desired amplifier output voltage. This can be achieved, for example, by adding a constant value to the analog voltage proportional to the amplifier input voltage or by the appropriate selection beforehand of the characteristic curve of the analog-digital converter.

BRIEF DESCRIPTION OF THE DRAWING

The invention will be explained in greater detail below with the aid of the accompanying drawings in which.

DESCRIPTION OF THE PREFERRED EMBODIMENTS

Figure 1A:
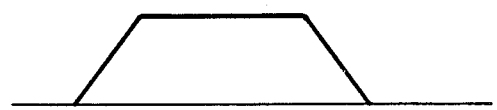
FIG. 1a and 1b show the time slopes of current and voltage at a gradient coil arrangement.
Figure 1B:
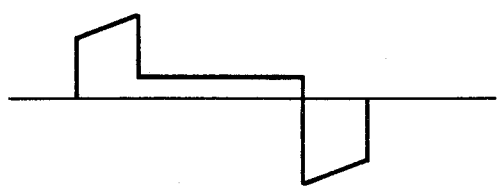
Figure 2:
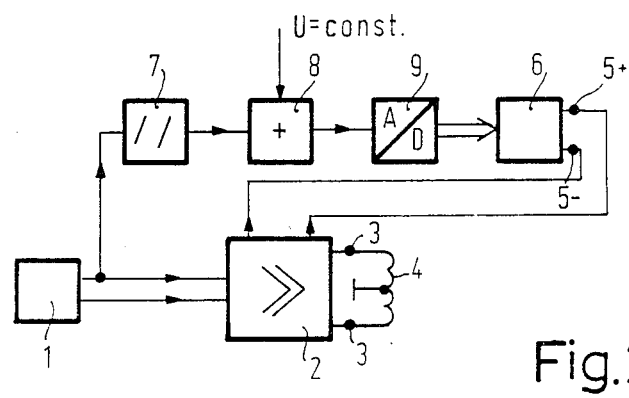
FIG. 2 shows an embodiment of the invention.

In FIG. 2, an input stage generates an output voltage the time curve of which largely corresponds to that in FIG. 1b. The circuit can contain a digital memory which stores the time curve of the magnetic flux as in FIG. 1a at a sequence of support points. This sequence is converted by means of a digital-analog converter into an analog signal as per FIG. 1a, from which the voltage curve in FIG. 1b can then be generated by an analog network. This voltage can be tapped at the output terminals of circuit 1, the voltage at the outputs being in push-pull connection and connected symmetrically to ground. This voltage is fed to an amplifier 2 having output terminals 3 which are connected to a gradient coil 4 having a central tapping which is grounded. The supply voltage is taken from the d.c. output $5+$, $5-$ of the voltage generator 6, the d.c. output voltage of which follows the voltage at the input of the amplifier in such a way that it is always a certain amount larger than the output voltage assigned to the input voltage at the amplifier output.

Figure 3:
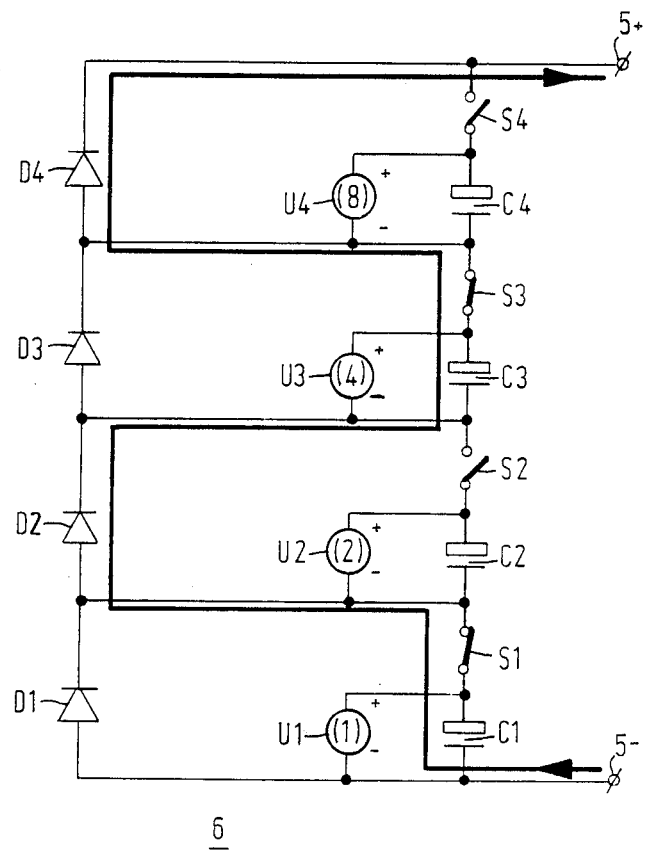
FIG. 3 shows the circuit of the voltage generator.

The voltage generator 6 is shown in detail in FIG. 3. It comprises four d.c. voltage sources $U_1$, $U_2$, $U_3$, $U_4$ which deliver voltages of 5 V, 10 V, 20 V, 40 V which means that their d.c. voltages are in the ratio 1:2:4:8. Each of the voltage sources $U_1$ ... $U_4$ is connected in parallel with a capacitor $C_1$ ... $C_4$ the capacitance of which is dimensioned in such a way that it can supply the peak power (during the voltage pulses at the beginning and at the end). The voltage sources $U_1$ ... $U_4$ need to be designed only for the mean power when they are only active in these phases for the supply voltage. For the rest, the capacitors provide smoothing.

An electronically controllable switch $S_1$ ... $S_4$ is connected in series with each of the d.c. voltage sources. An output terminal $5+$ is connected to switch $S_4$, while the d.c. voltage output terminal $5-$ is connected to the voltage source $U_1$. If several switches are closed, then the d.c. voltages of the associated voltage sources are added together. Connected between the d.c. voltage output terminals $5+$, $5-$ is the series arrangement of four diodes $D_1$ ... $D_4$, the connection points of which are each connected to the like pole of the voltage sources $U_1$ ... $U_4$. If, therefore, more than one switch is open (switches $S_2$ and $S_4$ in FIG. 3), then the direct current generated by d.c. voltage sources $U_1$ and $U_3$, whose switches ($S_1$ and $S_3$) are closed, flows via the diodes ($D_2$ and $D_4$) which are allocated to the inactive voltage sources ($U_2$ and $U_4$). The result of this is that the diodes $D_1$ ... $D_4$ with the same forward direction have to be connected in series so that, on the one hand, they can conduct the current delivered by the other d.c. voltage sources and, on the other, they do not short-circuit the allocated voltage source. The resulting current flow is indicated by the solid continuous line in FIG. 3.

The switch arrangement $S_1$ ... $S_4$ is controlled by a control circuit which can comprise a circuit 7 (FIG. 2) for the absolute value formation, an adding stage 8 and an analog-digital converter 9. The circuit 7 for the absolute value formation converts the signal fed to the amplifier 2 into a voltage which is proportional to the amount of this signal. The output voltage of this circuit is fed to one input of an analog adding stage 8 at the other adding input of which there is a constant voltage which has the same polarity as the output signal of circuit 7. The output signal of the adding stage is fed to an analog-digital converter 9 which converts the analog input voltage into a digital data word and thereby controls the switch arrangement. The most significant bit of this data word controls switch $S_4$ which switches on or off the d.c. voltage source $U_4$ with the highest d.c. voltage, the second most significant bit controls switch $S_3$ for the d.c. voltage source $U_3$ with the second highest d.c. voltage etc. If the analog-digital converter 9 delivers a control signal with more than four bits, only the four most significant bits are used for the control of switches $S_1$ ... $S_4$.

Figure 5:
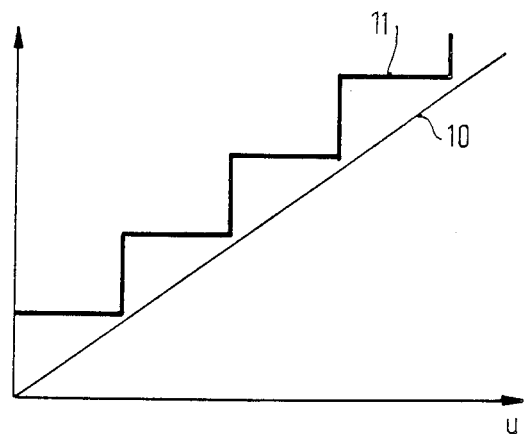

The layout of the control circuits 7, 8, 9, in particular the magnitude of the d.c. voltage to be added, follows from FIG. 5 in which the dependences of the output voltage of the amplifier (straight line 10) and of the output voltage of the d.c. voltage generator (curve 11) are represented as a function of the amplifier input voltage u. It can be seen that the curve 11 is always positioned above the straight line 10, and in such a way that the difference never falls below a minimum value. This minimum value is dimensioned in such a way that for every input voltage u the amplifier is in a position to generate at terminals 3 the output voltage resulting from the characteristic 10. It is also possible, however, to omit the adding stage 8 and to make the analog-digital converter non-linear from the outset so that a characteristic curve like that in FIG. 5 is obtained.

Figure 4:
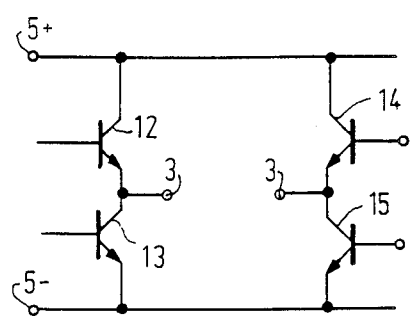
FIG. 4 shows the output stage of an amplifier for the gradient coil arrangement and FIG. 5 shows the characteristic curves of the amplifier and the control circuit.

As FIG. 1b shows, the polarity of the voltage at the gradient coil 4 varies. Consequently, the amplifier must be designed in such a way that it can deliver positive and negative output voltages. A suitable embodiment of the output stage of such an amplifier is shown in FIG. 4. This is a transistor bridge amplifier which in each of its two branches connected between the $5+$ and $5-$ output terminals of the voltage generator 6 contains the series arrangement of two npn-transistors 12 and 13 and 14 and 15, respectively. The transistor bridges are controlled in such a way that the voltage between the bases of two series-connected transistors remains largely constant and that the potentials at the bases of transistors 12 and 13 and 14 and 15, on the other hand, are varied in push-pull action. The driver and, where appropriate, preamplifier stages required for this can be connected to the supply voltage delivered by voltage generator 6. However, connection is also possible to a separate d.c. voltage generator.

The starting point of the above description was a circuit arrangement with a gradient coil such as may form part of an NMR tomography unit. However, the invention can also be applied—in all cases where the concern is to reduce the power loss of an amplifier, particularly in the case of an inductive or capacitive load.

As a rule, the supply voltage cannot follow a change of the input voltage as quickly as the output voltage of the amplifier can. Therefore distortion can occur at the output of the amplifier when the input voltage increases. In an NMR tomography unit such short-lived distortions usually are not a disturbing factor. In applications in which these distortions are not acceptable the input voltage could be fed to the amplifier via a delay element so that the supply voltage is already increased, where necessary, if the amplifier input voltage requires a larger supply voltage. To prevent the supply voltge from falling before the input signal has decreased accordingly, the control circuit or the d.c. voltage generator could be operated in such a way that a small time constant is obtained in the case of voltage rises and a large time constant in the case of voltage drops.

What is claimed is:

1. A NMR circuit for energizing a gradient coil arrangement of a NMR tomography apparatus comprising: a power amplifier having an output for connection to the gradient coil arrangement and an input for receiving an input signal voltage, a voltage generator having an output for coupling to said power amplifier DC supply voltages variable in steps, said voltage generator comprising a plurality of DC voltage sources providing DC voltages of different magnitudes, a switch arrangement for connecting one of the DC voltage sources or a series arrangement of plural DC voltage sources to the output of the voltage generator, each DC voltage source having a respective capacitor connected in parallel therewith, and a control circuit responsive to said input signal for deriving a control voltage for controlling the switch arrangement such that the voltage at the output of the voltage generator follows the input signal voltage in steps, but always remains a certain amount larger than the amplitude of the input voltage multiplied by the gain of the power amplifier.

2. A NMR circuit as claimed in claim 1 wherein the switch arrangement comprises a plurality of switches with an individual switch in series with each of said DC voltage sources, and a plurality of diodes connected in series aiding and with each diode connected in parallel with a respective series arrangement of a switch and a DC voltage source, each said diode providing a shunt current path when its associated switch is open.

3. A circuit as claimed in claim 2 wherein said DC voltage sources provide a sequence of binary weighted DC voltage in the ratio of 1:2:4 etc.

4. A NMR circuit as claimed in claim 1 wherein said DC voltage sources provide voltages in a binary weighted relationship (V, 2V, 4V).

5. A NMR circuit as claimed in claim 4 wherein the control circuit includes an analog/digital converter which converts the input signal into a binary coded data word the most significant digits of which form the control voltage.

6. A circuit as claimed in claim 1 further comprising means for generating said input signal voltage said generating means producing a signal voltage waveform such that, when applied to a gradient coil load via said power amplifier, causes a trapezoidal shaped current to flow in said load.

7. A circuit as claimed in claim 1, wherein the control circuit derives said control voltage independently of an output signal produced at said amplifier output.

8. A circuit arrangement as claimed in claim 1, wherein the d.c. voltage of each voltage source is twice as big or twice as small as the next smallest or next largest d.c. voltage, respectively, of another d.c. voltage source.

9. A circuit for energizing an inductive load comprising: means for generating a voltage with a waveform comprising first and second generally trapezoidal shaped portions in mirror relation and connected by an approximately constant relatively low voltage portion, a power amplifier having an output for supplying an output voltage to the load and an input for receiving the generated voltage, a voltage generator having an output supplying stepwise variable DC supply voltage to the power amplifier, said voltage generator comprising a plurality of DC voltage sources providing DC voltages of different magnitudes, a switch arrangement for connecting one of the DC voltage sources or a series arrangement of plural DC voltage sources to the output of the voltage generator, and a control circuit responsive to the generated voltage to derive a control signal for controlling the switch arrangement such that the voltage at the voltage generator output follows the input voltage in steps but with a greater amplitude than that of said output voltage of the power amplifier.

10. A circuit as claimed in claim 9 wherein the switch arrangement comprises an individual switch in series with each of said DC voltage sources, and a plurality of diodes connected in series aiding and with each diode connected in parallel with a respective series arrangement of a switch and a DC voltage source.

11. A circuit as claimed in claim 10 further comprising a plurality of capacitors of different capacitance values and with individual ones of said capacitors connected in parallel with individual ones of at least some of said DC voltage sources.

12. A circuit as claimed in claim 9 wherein the control circuit includes an analog/digital converter which converts a signal derived from the generated voltage into a binary coded data word the most significant digits of which form the control signal, and said DC voltage sources provide voltages in a binary weighted relationship.

13. A circuit as claimed in claim 9 further comprising a gradient coil arrangement which forms the inductive load of the amplifier, whereby the circuit is adapted for operation in an NMR tomography system.

14. A circuit arrangement comprising:
an amplifier having an output for connection to a load,
a voltage generator having a DC output which delivers a DC supply voltage to at least an output stage of the amplifier, the voltage generator comprising a plurality of DC voltage sources providing DC voltages of differing magnitude wherein the DC voltage of each voltage source is twice as big or twice as small as the next smallest or next largest DC voltage, respectively, of another DC voltage source, and a switch arrangement which connects one of the DC voltage sources or a series arrangement of plural DC voltage sources to the DC output of the voltage generator, and
a control circuit responsive to an input signal voltage (u) of the amplifier to derive a control signal for controlling the switch arrangement such that the voltage at the DC output follows the input voltage in steps, but always remains a certain amount larger than the value of the input voltage multiplied by the gain of the amplifier, the control circuit including an analog-digital converter which converts a signal derived from the amplifier input signal voltage (u) into a binary coded data word the most significant digits of which form the control signal, a high-order bit activating the switch arrangement for switching on of the DC voltage source with the higher DC voltage.

15. A circuit arrangement comprising:

an amplifier having an output for connection to a load, a voltage generator having a DC output which delivers a DC supply voltage to at least an output stage of the amplifier, the voltage generator comprising a plurality of DC voltage sources providing DC voltage of differing magnitude and a switch arrangement which connects one of the DC voltage sources or a series arrangement of plural DC voltage sources to the DC output of the voltage generator, and a control circuit responsive to an input signal voltage (u) of the amplifier to derive a control signal for controlling the switch arrangement such that the voltage at the DC output follows the input voltage in steps, but always remains a certain amount larger than the value of the input voltage multiplied by the gain of the amplifier, and wherein the control circuit includes an analog-digital converter which converts a signal derived from said input signal voltage of the amplifier into a binary coded data word the most significant digits of which form the control signal.

* * * * *